US009559137B2

United States Patent
Chen et al.

(10) Patent No.: US 9,559,137 B2
(45) Date of Patent: Jan. 31, 2017

(54) COLOR FILTER OF ILLUMINATION IMAGE SENSOR AND METHOD FOR FABRICATING THE SAME

(75) Inventors: Hao-Min Chen, Chiayi (CN); Chen-Wei Lu, Hsinchu County (CN); Chih-Kung Chang, Hsinchu County (CN)

(73) Assignee: VISERA TECHNOLOGIES COMPANY LIMITED, Hsinchu Science Park (TW)

( * ) Notice: Subject to any disclaimer, the term of this patent is extended or adjusted under 35 U.S.C. 154(b) by 1826 days.

(21) Appl. No.: 12/940,756

(22) Filed: Nov. 5, 2010

(65) Prior Publication Data
US 2012/0113304 A1   May 10, 2012

(51) Int. Cl.
*H01L 27/146* (2006.01)
(52) U.S. Cl.
CPC ..... *H01L 27/1464* (2013.01); *H01L 27/14621* (2013.01); *H01L 27/14623* (2013.01)
(58) Field of Classification Search
CPC ........... H01L 27/14632; H01L 27/1464; H01L 27/14621; H01L 27/14627; H01L 27/14645; H01L 27/14818; H01L 27/14843
USPC ................................. 348/272–280
See application file for complete search history.

(56) References Cited

U.S. PATENT DOCUMENTS

| 5,667,202 | A | * | 9/1997 | Gwinn | 267/33 |
| 2007/0087467 | A1 | * | 4/2007 | Hsu et al. | 438/57 |
| 2008/0150057 | A1 | * | 6/2008 | Lee et al. | 257/432 |
| 2008/0150062 | A1 | * | 6/2008 | Hwang | 257/432 |
| 2009/0050594 | A1 | * | 2/2009 | Bui et al. | 213/75 R |
| 2009/0152660 | A1 | * | 6/2009 | Park | 257/432 |
| 2009/0246651 | A1 | * | 10/2009 | Fujimori et al. | 430/7 |
| 2009/0303359 | A1 | * | 12/2009 | Otsuka et al. | 348/280 |

FOREIGN PATENT DOCUMENTS

| CN | 101588506 A | 11/2009 |
| JP | 61-073368 A | 4/1986 |
| JP | 2000329928 A | 11/2000 |
| JP | 2010062417 A | 3/2010 |

* cited by examiner

*Primary Examiner* — Roberto Velez
*Assistant Examiner* — Tuan Le
(74) *Attorney, Agent, or Firm* — Muncy, Geissler, Olds & Lowe, P.C.

(57) ABSTRACT

The invention provides a color filter of an illumination image sensor and a method for fabricating the same. A color filter of an illumination image sensor includes a light shield portion constructed by a plurality of grid photoresist patterns, wherein the light shield portion covers a back side surface of the silicon wafer in a periphery region of an illumination image sensor chip.

16 Claims, 10 Drawing Sheets

102B  102G  102R  102M

COLOR FILTER OF ILLUMINATION IMAGE SENSOR AND METHOD FOR FABRICATING THE SAME

BACKGROUND OF THE INVENTION

Field of the Invention

The present invention relates to a color filter of an illumination image sensor and method for fabricating the same, and in particular, to a light shield portion of a color filter of an illumination image sensor and method for fabricating the same.

Description of the Related Art

FIG. 1 is a top view showing a conventional color filter 102 for a back side illumination image sensor. The conventional color filter 102 comprises a sensing portion 106 and a light shield portion 104. The sensing portion 106 is constructed by a plurality of red grid photoresist patterns 102R, green grid photoresist patterns 102G and photoresist pixels 102B. The light shield portion 104 of the conventional color filter 102 is usually formed by a layer 102M of Cr or black resin. However, during the conventional color filter fabricating process, different materials (102R, 102G, 102B and 102M) between the sensing portion 106 and the light shield portion 104 result in a thermal stress problem. The aforementioned thermal stress problem reduces performance of the back side illumination image sensor.

Thus, a novel compact color filter of an illumination image sensor and method for fabricating the same are desired.

BRIEF SUMMARY OF INVENTION

A color filter of an illumination image sensor and method for fabricating the same are provided. An exemplary embodiment of a color filter of an illumination image sensor comprises a light shield portion constructed by grid photoresist patterns, wherein the light shield portion covers a periphery region of an illumination image sensor chip.

A method for fabricating a color filter of an illumination image sensor comprises forming grid photoresist patterns covering a periphery region of an illumination image sensor chip.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
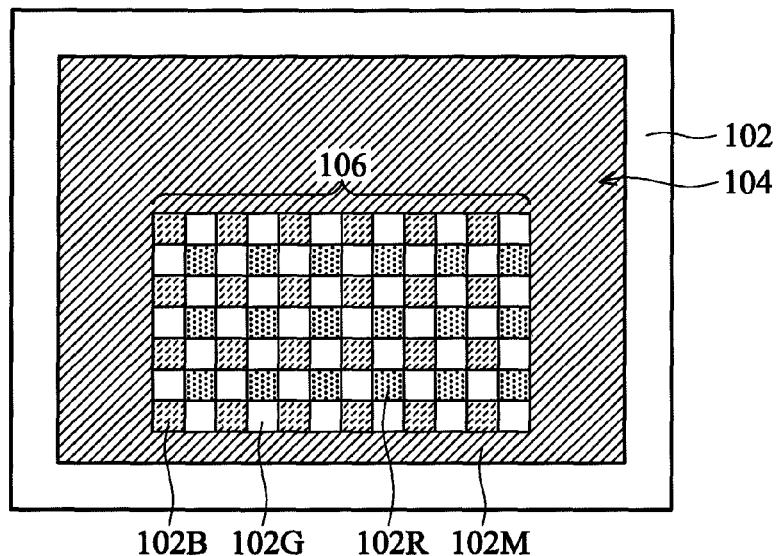
FIG. 1 is a top view showing the conventional color filter of an illumination image sensor.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 2:
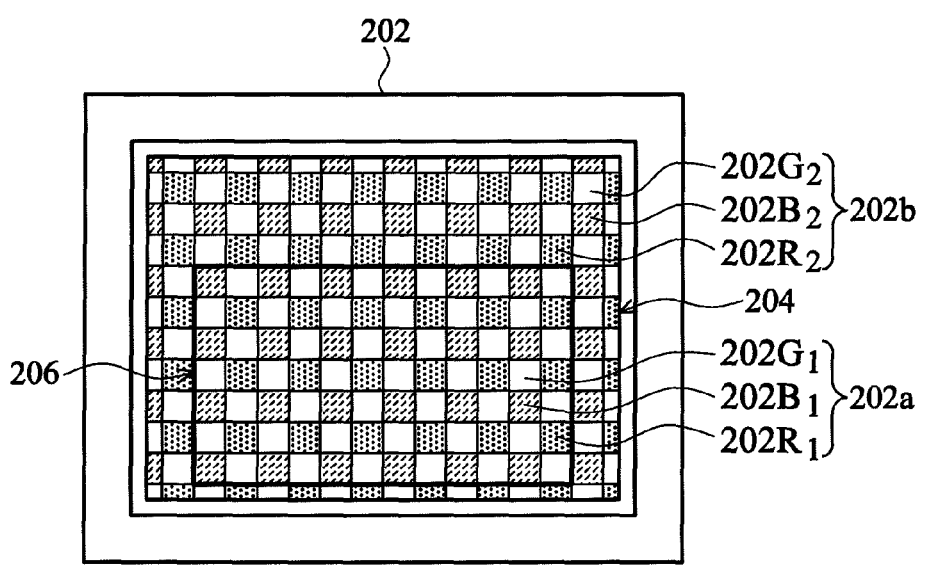
FIG. 2 is a top view showing one exemplary embodiment of a color filter of an illumination image sensor of the invention.

FIG. 2 is a top view showing one exemplary embodiment of a color filter 202 of an illumination image sensor of the invention. As shown in FIG. 2, one exemplary embodiment of the color filter 202 may comprise a light shield portion 204 and a sensing portion 206. The light shield portion 204 of the color filter 202 covers a periphery region of an illumination image sensor chip. Also, the sensing portion 206 of the color filter 202 covers a sensing region of an illumination image sensor chip. In one embodiment, the periphery region is a region where periphery circuits such as logic circuits are disposed therein, and the sensing region is a region where photo diodes are disposed therein to sense light. As shown in FIG. 2, the sensing portion 206 of the color filter 202 is usually composed of a plurality of grid photoresist patterns 202a including a plurality of red grid photoresist patterns $202R_1$, green grid photoresist patterns $202G_1$ and blue grid photoresist patterns $202B_1$ arranged as an array according to design, which facilitates the underlying photodiodes to receive filtered light. As shown in FIG. 2, in one embodiment, the light shield portion 204 of the color filter 202 may be composed of a plurality of grid photoresist patterns 202b similar to the photoresist patterns 202a. The amount of grid photoresist patterns 202b is not limited herein but according to design. In one embodiment, the amount of grid photoresist patterns may be larger than 1. For example, the grid photoresist patterns 202b may comprise a plurality of photoresist patterns such as red grid photoresist patterns $202R_2$, green grid photoresist patterns $202G_2$ and blue grid photoresist patterns $202B_2$ arranged in an array. In one embodiment, materials of the grid photoresist patterns 202b are the same as those of the sensing portion 206 of the color filter 202. Additionally, size of the grid photoresist patterns $202R_2$, $202G_2$ and $202B_2$ in the periphery region may be larger, smaller or the same as the grid photoresist patterns $202R_1$, $202G_1$ and $202B_1$ in the sensing region of an illumination image sensor chip. For example, the grid photoresist patterns $202R_2$, $202G_2$ and $202B_2$ may have a size which is larger than 0.4 μm. Therefore, the thermal stress of the color filter caused by material mismatch between the sensing portion and the light shield portion during the color filter fabricating process can be reduced.

Figure 3A:
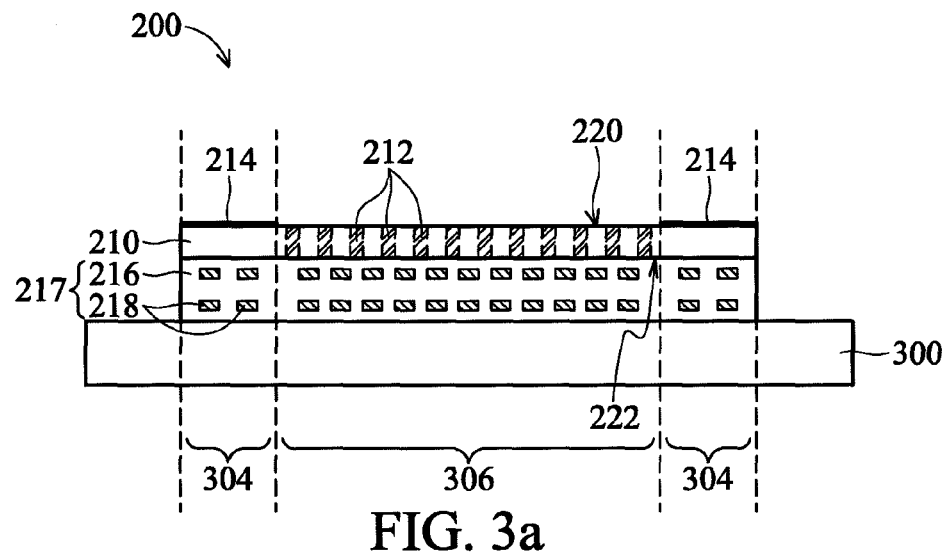
FIGS. 3a-3e are cross section views showing a method for fabricating a color filter of an illumination image sensor of the invention.

FIGS. 3a-3e are cross section views showing a method for fabricating a color filter 202 of an illumination image sensor 500 of the invention. In one embodiment, the illumination image sensor 500 may be a back side illumination (BSI) image sensor, although a front side illumination (FSI) image sensor can be also used. Please refer to FIG. 3a, wherein an illumination image sensor chip 200 is provided. The illumination image sensor chip 200 comprises a silicon wafer 210 having a front side surface 222 and a back side surface 220. In one embodiment, the illumination image sensor chip 200 may comprise a sensing region 306 and a periphery region 304 adjacent thereto. As mentioned above, the periphery region 304 is a region where periphery circuits such as logic circuits are disposed therein, and the sensing region 306 is a region where photo diodes are disposed therein to sense light. A plurality of photo diodes 212 are formed in the sensing region 306 of the silicon wafer 210 and an interconnect structure 217, which comprises at least one interlayer dielectric 216 and metal wirings 218, formed both in the periphery region 304 and the sensing region 306 on the front side surface 222 of the silicon wafer 210. In one embodiment, the interconnect structure 217 of the illumination image sensor chip 200 may be bonded on a carrier 300 for a wafer thinning process. The wafer thinning process may remove a portion of the silicon wafer 210 from the back side surface 220. Therefore, the photo diodes 212 can be exposed from the back side surface 220 of the silicon wafer 210. As shown in FIG. 3a, a metal layer 214 may be formed on the back side surface 220 in the periphery region 304, wherein the metal layer 214 with a light shielding function, may be isolated from the interconnect structure 217.

Figure 3B:
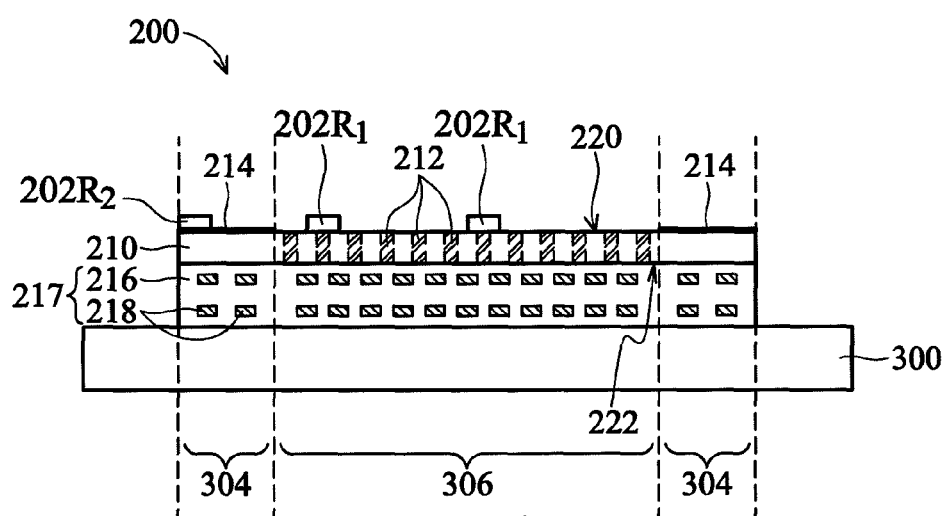

Next, please refer to FIG. 3b, wherein a first photolithography process may be performed to form at least one red grid photoresist pattern $202R_1$ in the sensing region 306, covering the silicon wafer 210. Also, the first photolithography process may be performed to form at least one red grid photoresist pattern $202R_2$ in the periphery region 304, covering the metal layer 214 on the silicon wafer 210. In one embodiment, the red grid photoresist patterns $202R_1$ and $202R_2$ may be formed in one step or in different steps. The red grid photoresist patterns $202R_1$ and $202R_2$ may have the same or different shapes and sizes. As shown in FIG. 3b, each of the red grid photoresist patterns $202R_1$ covers one of the photo diodes 212.

Figure 3C:
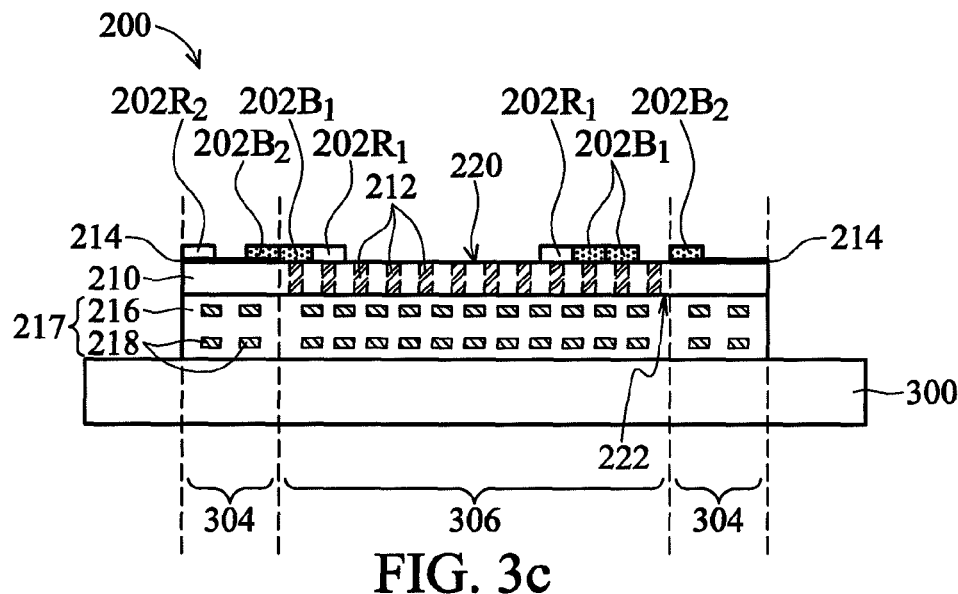

Next, please refer to FIG. 3c, wherein a second photolithography process may be performed to form at least one blue grid photoresist pattern $202B_1$ in the sensing region 306, covering the silicon wafer 210. Also, the second photolithography process may be performed to form at least one blue grid photoresist patterns $202B_2$ in the periphery region 304, covering the metal layer 214 on the silicon wafer 210. Similar to the red grid photoresist patterns $202R_1$ and $202R_2$ as shown in FIG. 3b, the blue grid photoresist patterns $202B_1$ and $202B_2$ may have the same or different shapes and sizes. As shown in FIG. 3c, each of the blue grid photoresist patterns $202B_1$ covers one of the photo diodes 212.

Figure 3D:
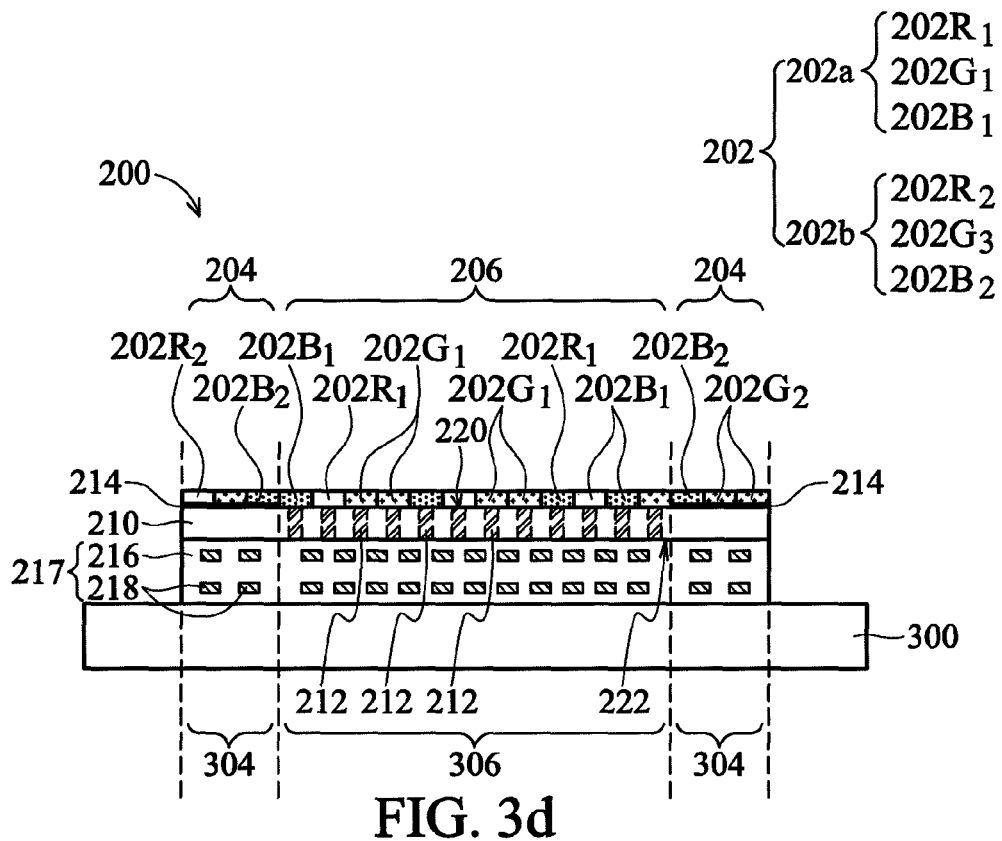

Next, please refer to FIG. 3d, wherein a third photolithography process may be performed to form at least one green photoresist pixel $202G_1$ in the sensing region 306, covering the silicon wafer 210. Also, the third photolithography process may be performed to form at least one green grid photoresist patterns $202G_2$ in the periphery region 304, covering the metal layer 214 on the silicon wafer 210. Similar to the red grid photoresist patterns $202R_1$ and $202R_2$ and the blue grid photoresist patterns $202B_1$ and $202B_2$ as shown in FIGS. 3a and 3b, the green grid photoresist patterns $202G_1$ and $202G_2$ may have the same or different shapes and sizes. As shown in FIG. 3d, each of the green grid photoresist patterns $202G_1$ covers one of the photo diodes 212. Additionally, in one embodiment as shown in FIG. 3d, the red grid photoresist patterns $202R_1$, $202R_2$, the green grid photoresist patterns $202G_1$, $202G_2$ and the blue grid photoresist patterns $202B_1$, $202B_2$ are formed in the same level. Further, in one embodiment as shown in FIG. 3d, the red, green and blue grid photoresist patterns $202R_1$, $202B_1$ and $202G_1$ in combination form grid photoresist patterns 202a of a sensing portion 206 of a color filter 202. Also, the red, green and blue grid photoresist patterns $202R_2$, $202B_2$ and $202G_2$ in combination form grid photoresist patterns 202b of a light shield portion 204 of a color filter 202. In one embodiment, materials of the grid photoresist pattern in the light shield portion 204 are the same as those of the grid photoresist pattern in the sensing portion 206 of the color filter covering a sensing region of the illumination image sensor chip. Moreover, any two adjacent grid photoresist patterns of the red, green and blue grid photoresist patterns $202R_2$, $202B_2$ and $202G_2$ in the light shield portion of the color filter 202 may be connected to each other.

Figure 3E:
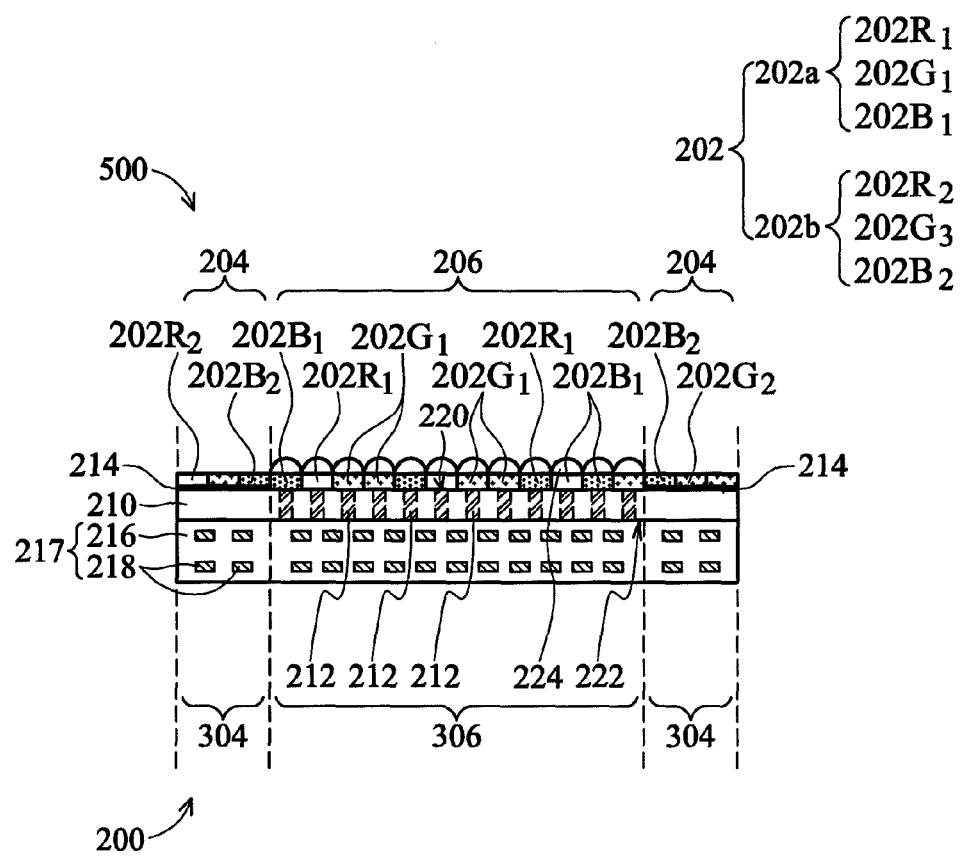

Next, please refer to FIG. 3e, wherein a plurality of micro lenses 224 is formed on the grid photoresist pattern 202a of the sensing portion of the color filter 202. The micro lenses 224 are respectively disposed on the red, green and blue grid photoresist patterns $202R_1$, $202B_1$ and $202G_1$. There are no micro lenses 224 formed on the grid photoresist patterns 202b of the light shield portion of a color filter 202. Therefore, an illumination image sensor 500 is formed.

Figure 4A:
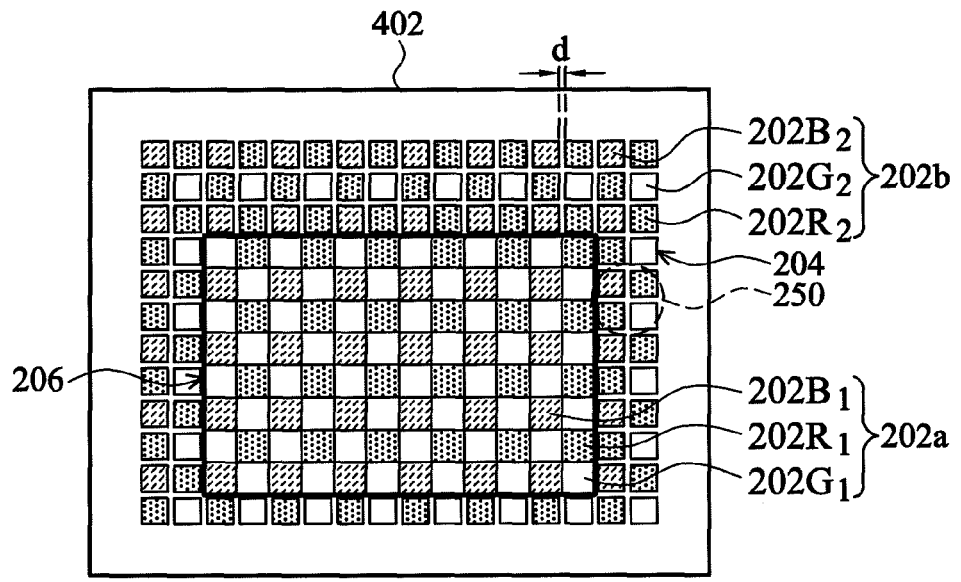
FIG. 4a is a top view showing another exemplary embodiment of a color filter of an illumination image sensor of the invention.
Figure 4B:
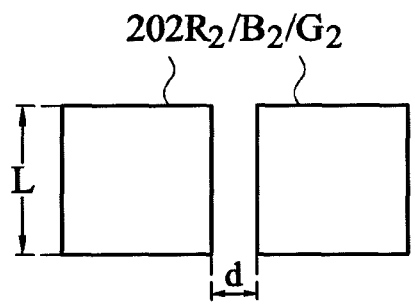
FIGS. 4b-4c illustrate enlarged views of FIG. 4a showing various exemplary embodiments of photoresist pixels of the invention.
Figure 4C:
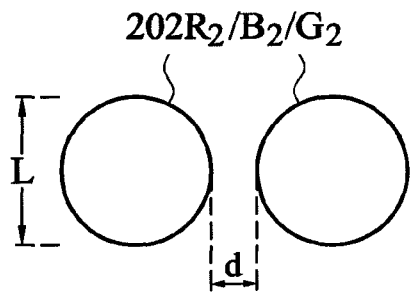

FIG. 4a is a top view showing another exemplary embodiment of a color filter of an illumination image sensor of the invention. Alternatively, any two adjacent grid photoresist patterns of the red, green and blue grid photoresist patterns $202R_2$, $202B_2$ and $202G_2$ in the light shield portion of the color filter 202 may be separated from each other by a gap d. FIGS. 4b-4c illustrate enlarged views of an area 250 FIG. 4a showing various exemplary embodiments of grid photoresist patterns of the invention. In one embodiment, the red, green and blue grid photoresist patterns $202R_2$, $202B_2$ or $202G_2$ in the light shield portion of the color filter 202 may have various shapes such as a circle (FIG. 4b) or a polygon (FIG. 4c). As shown in FIGS. 4b-4c, the red, green and blue grid photoresist patterns $202R_2$, $202B_2$ or $202G_2$ in the light shield portion 204 of the color filter 202 may have a size L which is larger than 0.4 μm.

Note that those skilled in the art should know that one exemplary embodiment of a color filter 202 uses the same material for the light shield portion 204 (covering the periphery region of the illumination image sensor) and the sensing portion 206 (covering the photo diodes of the illumination image sensor). Also, the light shield portion of the color filter 202 may be constructed by a grid photoresist pattern serving as a stress release structure. Therefore, the thermal stress of the color filter caused by material mismatch between the sensing portion and the light shield portion during the color filter fabricating process can be reduced. Additionally, some test items, for example, a dark current, a dark current ring or a blue channel tail up, may be further used to analyze the performances of an illumination image sensor with an exemplary embodiment of a color filter of the invention.

Figure 5A:
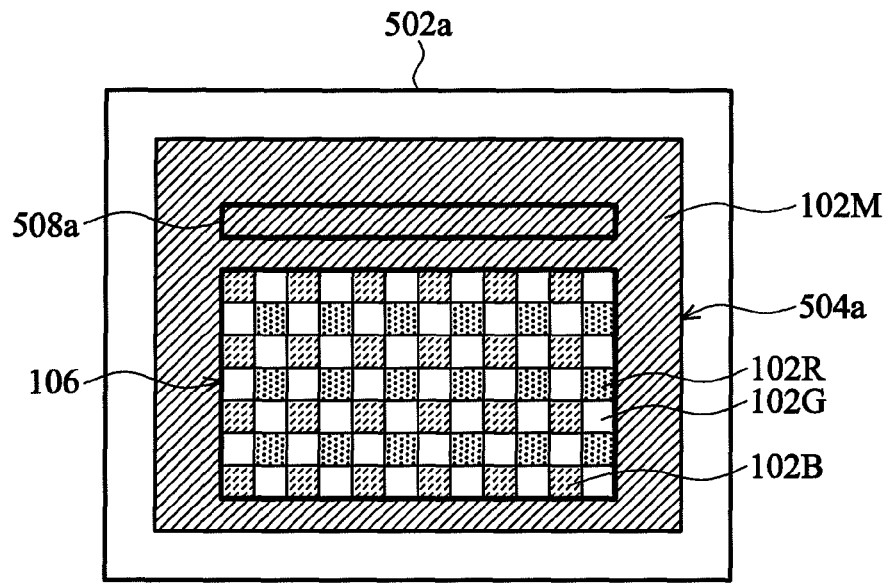
FIGS. 5a-5d illustrate a conventional color filter and various exemplary embodiments of a color filter of an illumination image sensor of the invention for testing.
Figure 5B:
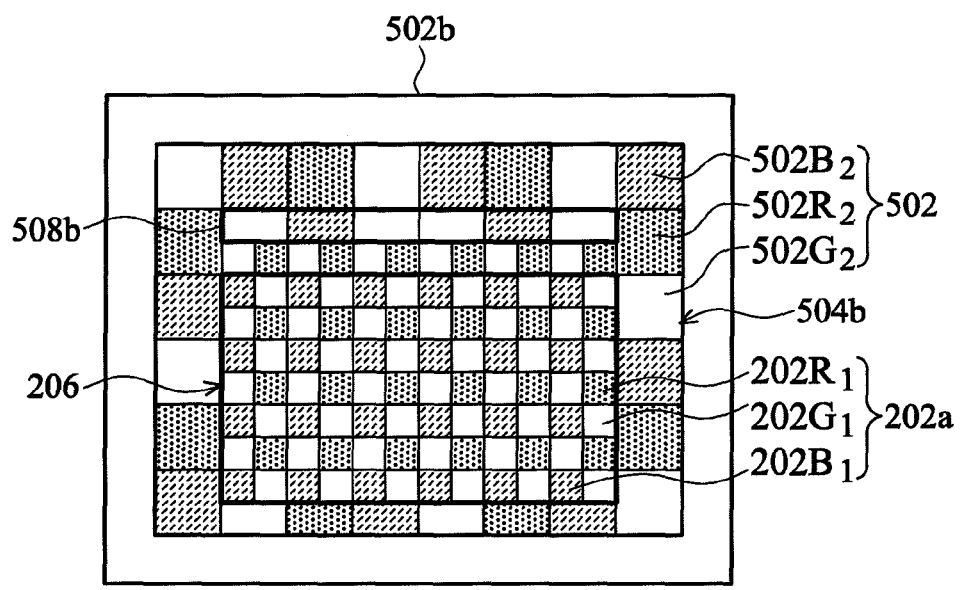
Figure 5C:
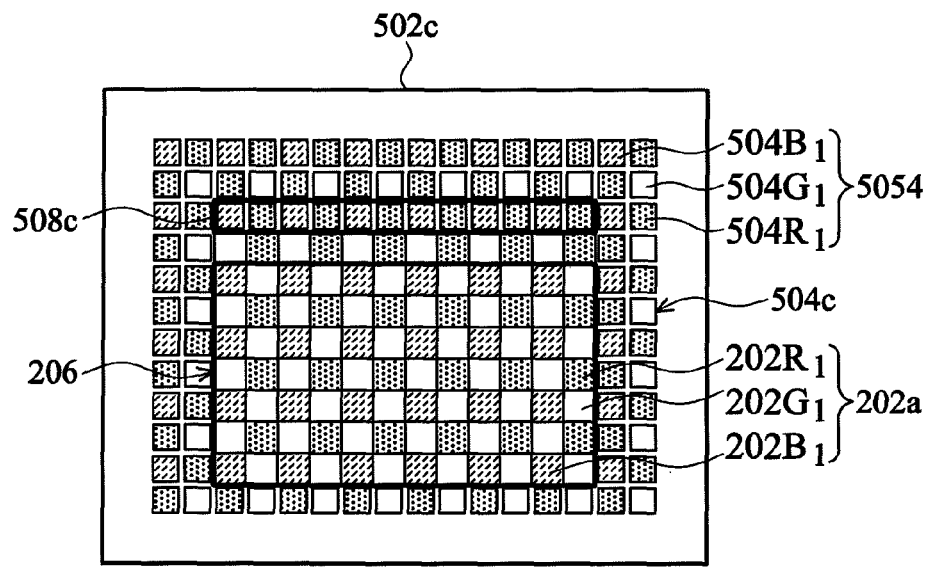
Figure 5D:
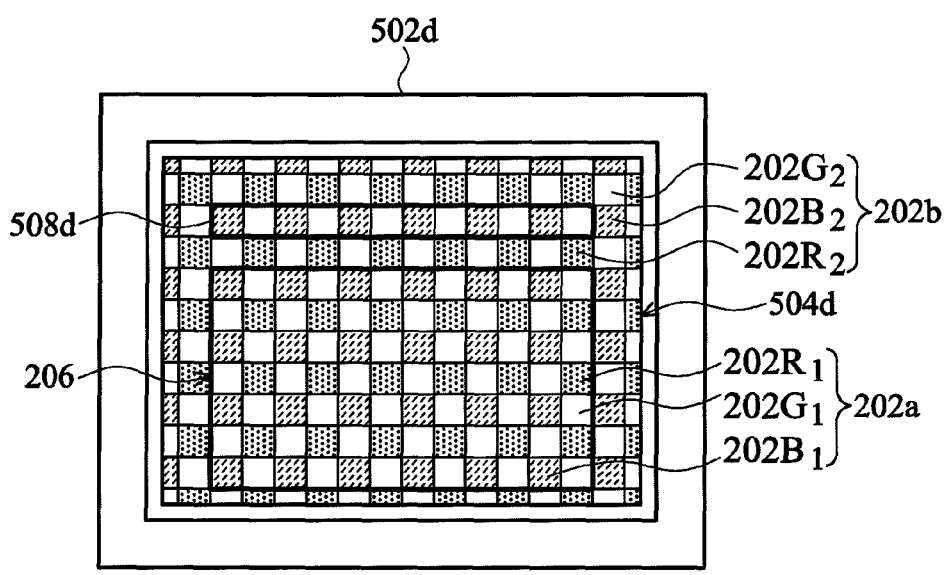

FIGS. 5a-5d illustrate a conventional color filter and various exemplary embodiments of a color filter of an illumination image sensor of the invention for testing. Specifically, FIG. 5a shows a conventional color filter 502a having a sensing portion 106 constructed by red/green/blue grid photoresist patterns 102R/G/B and a light shield portion 504a constructed by a layer 102M of Cr or black resin. The sensing portions 206 of color filters 502b-502d as shown in FIGS. 5b-5d are the same as the sensing portion 106 as shown in FIG. 5a, wherein the sensing portions 206 is constructed by a grid photoresist pattern 202a having a plurality of red/green/blue grid photoresist patterns $202R_1/G_1/B_1$ arranged in an array. FIG. 5b shows an exemplary embodiment of the color filter 502b, wherein a light shield portion 504b of the color filter 502b is constructed by grid photoresist patterns 502 similar to that in the sensing portions 206, with the exception, that the grid photoresist patterns 502 in the light shield portion 504b are constructed by red/green/blue grid photoresist patterns $502R_2/G_2/B_2$ with sizes which are twice as large as those of the red/green/blue grid photoresist patterns $202R_1/G_1/B_1$ in the sensing portion 206. FIG. 5c shows another exemplary embodiment of the color filter 502c, wherein a light shield portion 504c of the color filter 502c is constructed by grid photoresist patterns 504 similar to that in the sensing portions 206, with the exception, that the grid photoresist pattern 504 in the light shield portion 504c has red/green/blue grid photoresist patterns $504R_2/G_2/B_2$ with sizes which are about 20 percent smaller than that of the red/green/blue grid photoresist patterns $202R_1/G_1/B_1$ in the sensing portion 206. FIG. 5d shows an exemplary embodiment of the color filter 502d, wherein a light shield portion 504d of the color filter 502d is constructed by a plurality of grid photoresist patterns 202b similarly to that in the sensing portions 206, with the exception, that the grid photoresist patterns 202b in the light shield portions 504d are constructed by red/green/blue grid photoresist patterns $202R_2/G_2/B_2$ with sizes which are the same as that of the red/green/blue grid photoresist patterns $202R_1/G_1/B_1$ in the sensing portion 206. The conventional color filter 502a as shown in FIG. 5a and various exemplary embodiments of color filters 502b-502d as shown in FIGS. 5b-5d may be respectively disposed on back sides of illumination image sensors and, therefore, the illumination image sensors may serve as test samples to further analyze the performances of an illumination image sensor.

Figure 6A:
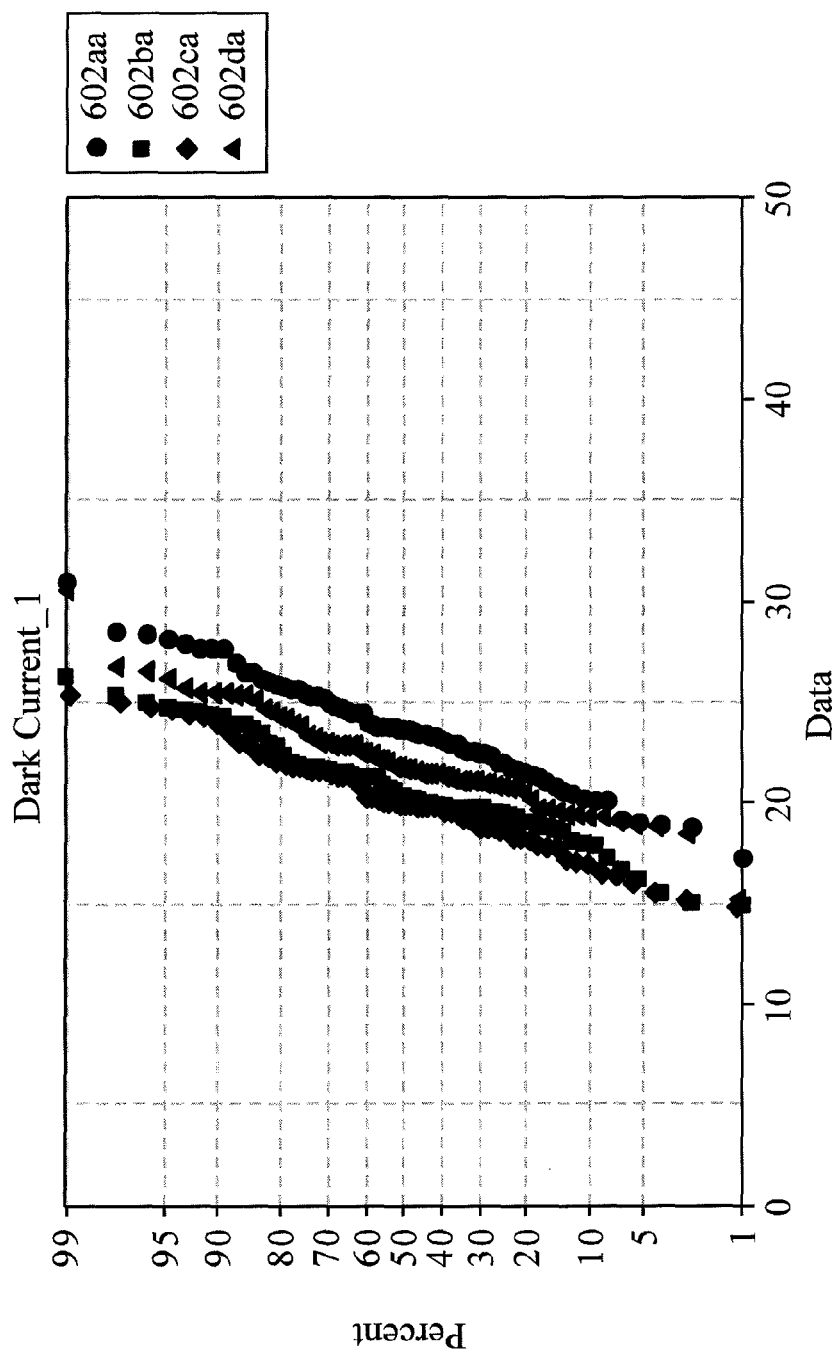
FIGS. 6a-6c illustrate dark current testing results of the conventional color filter and the various exemplary embodiments of the color filter as shown in FIGS. 5a-5d.
Figure 6B:
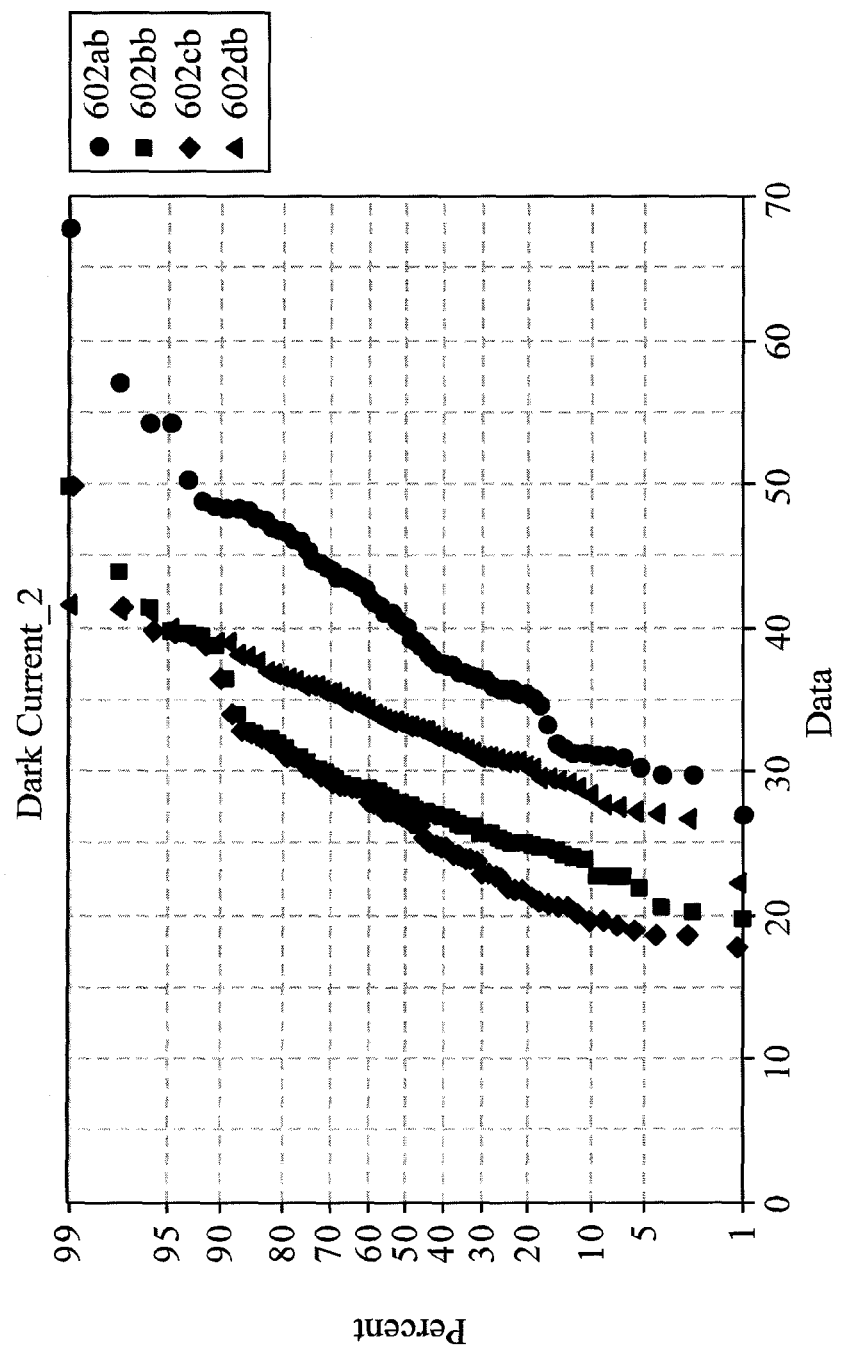
Figure 6C:
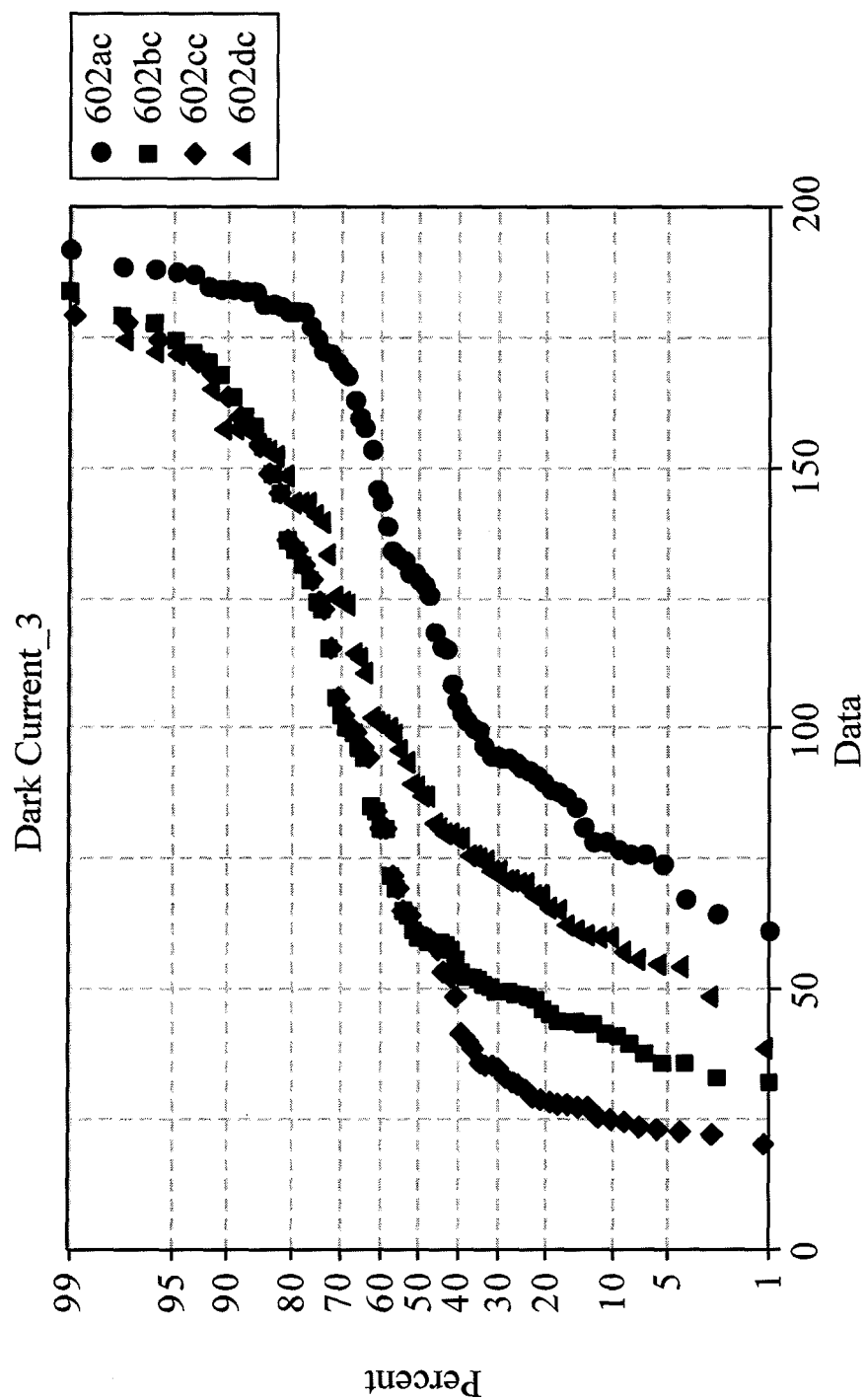

FIGS. 6a-6c illustrate dark current testing results of the conventional color filter 502a and the various exemplary embodiments of color filters 502b-502d as shown in FIGS. 5b-5d. Dark current is the relatively small electric current that flows through photosensitive devices such as a photomultiplier tube, photodiode, or charge-coupled device even when no photons are entering the device. Data dots 602aa, 602ba, 602ca and 602da shown in FIG. 6a respectively show the testing result of the dark current in the sensing portion (dark current 1) 106/206 of the color filters 502b-502d. As shown in FIG. 6a, the color filters 502b-502d show better dark current 1 testing results (Data dots 602ba, 602ca and 602da) than the conventional color filter 502a (Data dots 602aa). The color filter 502c (Data dots 602ca) shows the smallest dark current 1 testing result for the color filters 502b-502d (Data dots 602ba, 602ca and 602da).

Data dots 602ab, 602bb, 602cb and 602db shown in FIG. 6b respectively show the testing result of the dark current in an edge between the sensing portion 106/206 and the light shield portion 504a (dark current 2) of the color filters 502b-502d. As shown in FIG. 6b, the color filters 502b-502d show better dark current 2 testing results (Data dots 602bb, 602cb and 602db) than the conventional color filter 502a (Data dots 602ab). The color filter 502c (Data dots 602cb) shows the smallest dark current 2 testing result for the color filters 502b-502d (Data dots 602bb, 602cb and 602 db).

Data dots 602ac, 602bc, 602cc and 602dc shown in FIG. 6c respectively show the testing result of the dark current in the light shield portion (in region 508a/b/c/d) (dark current 3) of the color filters 502b-502d. As shown in FIG. 6c, the color filters 502b-502d show better dark current 3 testing results (Data dots 602bc, 602cc and 602dc) than the conventional color filter 502a (Data dots 602ac). The color filter 502c (Data dots 602cc) shows the smallest dark current 3 testing result for the color filters 502b-502d (Data dots 602bc, 602cc and 602dc).

TABLE 1

Dark current testing results comparison for the conventional color filter 502a and the color filters 502b-502d.

| | Dark current 1 | | Dark current 2 | | Dark current 3 | |
|---|---|---|---|---|---|---|
| | T0 | 24 hrs | T0 | 24 hrs | T0 | 24 hrs |
| conventional color filter 502a | 14.11 | 30.12 | 14.59 | 40.46 | 14.65 | 129.78 |
| color filter 502b | 14.06 | 23.09 | 14.53 | 28.60 | 14.15 | 83.70 |
| color filter 502c | 13.91 | 18.73 | 14.40 | 23.22 | 14.20 | 57.13 |
| color filter 502d | 13.92 | 22.2 | 14.48 | 33.45 | 14.45 | 101.63 |

Table 1 shows dark current testing results comparison measured at different wafer level temperature humidity storage stress (THS) conditions for the conventional color filter 502a and the color filters 502b-502d. Condition T0 means that the samples were tested before performing wafer level THS dark current testing. Condition 24 hrs means that the samples were tested after performing 24 hrs wafer level THS dark current testing. It is observed that the dark current values (dark current 1~3) at the condition 24 hrs is larger than the condition T0. Additionally, the dark current 3 shows a larger variation than the dark current 1 and 2. Further, the illumination image sensor with the color filter 502c shows better dark current testing result.

A color filter of an illumination image sensor and method for fabricating the same are provided. The color filter may have a light shield portion constructed by a plurality of grid photoresist pattern. Also, the grid photoresist patterns may be constructed by red/green/blue grid photoresist patterns with gaps therebetween to further improve the performances of an illumination image sensor such as dark current.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A color filter of an illumination image sensor, comprising:
   a light shield portion constructed by grid photoresist patterns, wherein the light shield portion covers a periphery region of an illumination image sensor chip, wherein the grid photoresist patterns are arranged in an array, and wherein the two adjacent grid photoresist patterns are separated from each other by a gap.

2. The color filter of an illumination image sensor as claimed in claim 1, wherein the illumination image sensor chip comprises a metal layer between the light shield portion and the periphery region of the illumination image sensor chip.

3. The color filter of an illumination image sensor as claimed in claim 1, wherein the amount of grid photoresist patterns is larger than 1.

4. The color filter of an illumination image sensor as claimed in claim 1, wherein the grid photoresist patterns have shapes comprising a circle or a polygon.

5. The color filter of an illumination image sensor as claimed in claim 1, wherein the two adjacent photoresist patterns have different sizes.

6. The color filter of an illumination image sensor as claimed in claim 1, wherein the photoresist patterns have sizes which are larger than 0.4 µm.

7. The color filter of an illumination image sensor as claimed in claim 1, wherein any one of the photoresist patterns has a color of red, green or blue.

8. The color filter of an illumination image sensor as claimed in claim 1, wherein materials of the grid photoresist pattern are the same as those of a sensing portion of the color filter covering a sensing region of the illumination image sensor chip.

9. A method for fabricating a color filter of an illumination image sensor, comprising:
    forming grid photoresist patterns covering a periphery region of an illumination image sensor chip, wherein the amount of grid photoresist patterns is larger than 1, and wherein the two adjacent grid photoresist patterns are separated from each other by a gap.

10. The method for fabricating a color filter of an illumination image sensor as claimed in claim 9, wherein the illumination image sensor comprises an interconnect structure formed thereon.

11. The method for fabricating a color filter of an illumination image sensor as claimed in claim 9, wherein forming the grid photoresist patterns comprises:
    forming at least one of the grid photoresist patterns having a first color selected from a group of red, green and blue.

12. The method for fabricating a color filter of an illumination image sensor as claimed in claim 11, further comprising:
    forming at least one of the grid photoresist patterns having a second color selected from a group of red, green and blue, wherein the second color is different from the first color.

13. The method for fabricating a color filter of an illumination image sensor as claimed in claim 12, further comprising:
    forming at least one of the grid photoresist patterns having a third color selected from a group of red, green and blue, wherein the third color is different from the first and second colors.

14. The method for fabricating a color filter of an illumination image sensor as claimed in claim 9, wherein the illumination image sensor chip comprises a metal layer between the grid photoresist patterns and the periphery region of the illumination image sensor chip.

15. The method for fabricating a color filter of an illumination image sensor as claimed in claim 9, wherein the grid photoresist patterns have shapes comprising a circle or a polygon.

16. The method for fabricating a color filter of an illumination image sensor as claimed in claim 9, wherein the grid photoresist patterns have a size which is larger than 0.4 µm.

* * * * *